United States Patent
Lu

(10) Patent No.: US 10,403,617 B2
(45) Date of Patent: *Sep. 3, 2019

(54) FINGERPRINT RECOGNITION MODULE HAVING LIGHT-EMITTING FUNCTION AND MANUFACTURING METHOD THEREFOR

(71) Applicant: Primax Electronics Ltd., Taipei (TW)

(72) Inventor: Tsung-Yi Lu, Taipei (TW)

(73) Assignee: PRIMAX ELECTRONICS LTD., Taipei (TW)

( * ) Notice: Subject to any disclaimer, the term of this patent is extended or adjusted under 35 U.S.C. 154(b) by 150 days.

This patent is subject to a terminal disclaimer.

(21) Appl. No.: 15/676,311

(22) Filed: Aug. 14, 2017

(65) Prior Publication Data
US 2018/0138163 A1    May 17, 2018

Related U.S. Application Data

(60) Provisional application No. 62/422,447, filed on Nov. 15, 2016.

(51) Int. Cl.
*H01L 25/00* (2006.01)
*H01L 33/52* (2010.01)
(Continued)

(52) U.S. Cl.
CPC .......... *H01L 25/50* (2013.01); *G06K 9/00013* (2013.01); *H01L 25/167* (2013.01); *H01L 33/52* (2013.01); *H01L 2933/005* (2013.01)

(58) Field of Classification Search
CPC ............... H01L 23/3142; H01L 23/492; H01L 23/4985; H01L 23/564; H01L 23/4853;
(Continued)

(56) References Cited

U.S. PATENT DOCUMENTS 5,828,773 A * 10/1998 Setlak .................. G06K 9/0002
382/126
5,963,679 A * 10/1999 Setlak .................. G06K 9/0002
382/312
(Continued)

*Primary Examiner* — Bobbak Safaipour
(74) *Attorney, Agent, or Firm* — Kirton McConkie; Evan R. Witt

(57) ABSTRACT

This application provides a fingerprint recognition module having a light-emitting function and a manufacturing method therefor. The fingerprint recognition module includes a flexible printed circuit (FPC) board, a die, a light-emitting diode component, an adhesive layer, and a cover plate. The manufacturing method includes the following steps: (a) directly connecting and fixing the die and the light-emitting diode component to the FPC board, and electrically connecting the die and the light-emitting diode component to the FPC board; (b) coating the adhesive layer on an upper surface of the die; (c) covering the adhesive layer with a cover plate, to adhere the cover plate to the adhesive layer; and (d) applying low pressure injection modeling encapsulation to an encapsulation space defined between the cover plate and the FPC board, so as to form an encapsulation layer in the encapsulation space to encapsulate the die and the light-emitting diode component.

10 Claims, 5 Drawing Sheets

(51) Int. Cl.
 H01L 25/16 (2006.01)
 G06K 9/00 (2006.01)
(58) Field of Classification Search
 CPC ... H01L 23/4871; H01L 23/565; H01L 23/78; G06K 9/00006
 See application file for complete search history.

(56) References Cited

U.S. PATENT DOCUMENTS

| | | | |
|---|---|---|---|
| 10,141,237 B2* | 11/2018 | Lu | H01L 23/3142 |
| 2005/0106784 A1* | 5/2005 | Xia | B29C 45/14065 |
| | | | 438/125 |
| 2007/0210468 A1* | 9/2007 | Tsuchida | B08B 1/00 |
| | | | 264/39 |
| 2016/0322283 A1* | 11/2016 | Mcmahon | H01L 23/562 |
| 2017/0152410 A1* | 6/2017 | Aoyama | C09J 9/02 |
| 2018/0138103 A1* | 5/2018 | Lu | H01L 23/3142 |

* cited by examiner

FINGERPRINT RECOGNITION MODULE HAVING LIGHT-EMITTING FUNCTION AND MANUFACTURING METHOD THEREFOR

FIELD OF THE INVENTION

This application relates to a fingerprint recognition module having a light-emitting function and a manufacturing method therefor, and in particular, to a fingerprint recognition module in which a die and a light-emitting diode component are directly connected to and disposed on a flexible printed circuit (FPC) board and a manufacturing method therefor, where a light-emitting function thereof enables a user to clearly learn a working status of a current fingerprint module.

BACKGROUND OF THE INVENTION

With rapid development of science and technologies, almost everyone is equipped with a mobile electronic apparatus or a notebook computer. To facilitate an identity of a user being securely recognized on a mobile electronic apparatus or a notebook computer, currently, a most popular and most secure approach of the biological recognition type is fingerprint recognition.

However, conventional fingerprint recognition modules in the market do not include a technology of encapsulating any light-emitting source (for example, an LED) together. That is, the conventional fingerprint recognition modules do not emit light. Therefore, when a finger user is located in an environment where a light source is not sufficient, a conventional fingerprint recognition module cannot indicate a position at which the finger user should press. Further, when the fingerprint recognition module is pressed and used, the user cannot learn a working status of the conventional fingerprint module.

In view of this, a conventional fingerprint recognition module and a manufacturing method therefor still need to be improved.

SUMMARY OF THE INVENTION

A main objective of the present invention is to provide a fingerprint recognition module having a light-emitting function and a manufacturing method therefor. By directly disposing a die and a light-emitting diode component on an FPC board, process steps of an entire fingerprint recognition module are simplified, and manufacturing costs are lowered.

Another objective of the present invention is to provide a fingerprint recognition module having a light-emitting function. By doping an encapsulation layer with an astigmatism powder substance and designing a peripheral ring-shaped transparent area along an edge of a cover plate, a light ray from a light-emitting diode component may pass through the encapsulation layer and evenly diverge, and then, be transmitted outward through the peripheral ring-shaped transparent area.

A preferred implementation concept of this application is to provide a manufacturing method for a fingerprint recognition module having a light-emitting function, including the following steps:

(a) directly connecting and fixing a die and a light-emitting diode component to an FPC board, and electrically connecting the die and the light-emitting diode component to the FPC board;

(b) coating an adhesive layer on an upper surface of the die;

(c) covering the adhesive layer with a cover plate, to adhere the cover plate to the adhesive layer; and (d) applying low pressure injection modeling encapsulation to an encapsulation space defined between the cover plate and the FPC board, so as to form an encapsulation layer in the encapsulation space.

In a preferred embodiment, step (d) further includes the following steps:

(d1) placing the FPC board, the die, the light-emitting diode component, the adhesive layer, and the cover plate together into a mold;

(d2) adjusting pressure of the mold into a range of 1.5 to 40 bars; and (d3) injecting a hot melt material into the mold to make the hot melt material flow into the encapsulation space and be cured in the encapsulation space to form the encapsulation layer, where the encapsulation layer seals the die.

In a preferred embodiment, in step (d3), the hot melt material is doped with an astigmatism powder substance, so as to transmit and disperse a light ray from the light-emitting diode component upward.

In a preferred embodiment, step (d3) further includes the following step:

(d30) injecting the hot melt material into the encapsulation space from a lateral side of the die through a feeding port of the mold.

In a preferred embodiment, before step (a), the method further includes the following step:

(a0) cutting a wafer into a plurality of dies.

In a preferred embodiment, after step (d), the method further includes the following step:

(e) removing and taking out the FPC board, the die, the adhesive layer, the cover plate, and the encapsulation layer that have been fixedly connected and combined with each other from the mold.

Another preferred implementation concept of this application is to provide a fingerprint recognition module having a light-emitting function, including:

an FPC board;

a die, directly connected to and disposed on the FPC board, and electrically connected to the FPC board;

a light-emitting diode component, disposed on the FPC board, and electrically connected to the FPC board;

an adhesive layer, coated on an upper surface of the die;

a cover plate, covering the adhesive layer; and an encapsulation layer, cured and formed between the FPC board and the cover plate, and sealing the die and the light-emitting diode component.

In a preferred embodiment, a hot melt material is selected as a material of the encapsulation layer, and the hot melt material is doped with an astigmatism powder substance, so as to transmit and disperse a light ray from the light-emitting diode component upward.

In a preferred embodiment, the cover plate is provided with a peripheral ring-shaped transparent area, and the peripheral ring-shaped transparent area is disposed along a circumference of the cover plate.

In a preferred embodiment, an upper surface of the encapsulation layer abuts against the cover plate, a lower surface of the encapsulation layer abuts against the FPC board, and the encapsulation layer surrounds and seals the die and the light-emitting diode component.

In a preferred embodiment, the adhesive layer is a die attach film (DAF) or a hydrogel.

In a preferred embodiment, the fingerprint recognition module further includes a carrier board, where the carrier board is located below the FPC board to carry the FPC board.

DETAILED DESCRIPTION OF THE PREFERRED EMBODIMENT

Figure 5:
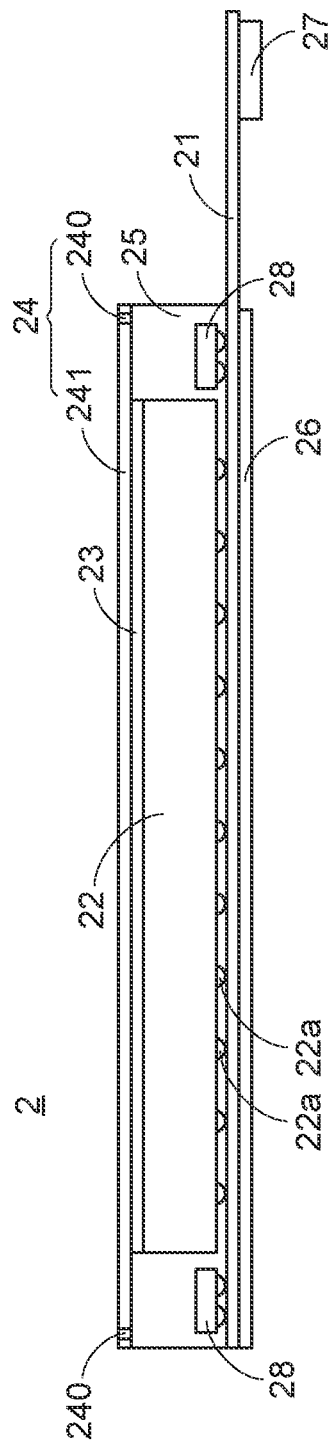
FIG. 5 is a sectional view of a fingerprint recognition module having a light-emitting function after completing low pressure injection modeling encapsulation according to this application.

Referring to FIG. 5, FIG. 5 is a sectional view of a fingerprint recognition module having a light-emitting function after completing low pressure injection modeling encapsulation according to this application, that is, a finished product of the fingerprint recognition module of this application. A fingerprint recognition module 2 of this application includes an FPC board 21, a die 22, a light-emitting diode component 28, an adhesive layer 23, a cover plate 24, and an encapsulation layer 25. It should be first noted that an FPC board is usually briefly referred to as a flexible board, on which after processing processes, such as etching, are performed, a plurality of needed circuits is finally reserved (not shown in the figure) as an electronic signal transmission medium. The die 22 of this application is a process of a through-silicon via (TSV). In this application, the die 22 and the light-emitting diode component 28 are disposed on a circuit of an FPC board in a direct contact manner, so as to electrically connect the die 22 and the light-emitting diode component 28, and the FPC board 21 to each other.

Further, to dispose the cover plate 24 above the die 22, an adhesive layer 23 is disposed between the die 22 and the cover plate 24. That is, an adhesive layer 23 is coated on an upper surface of the die 22, so as to cover the adhesive layer 23 with the cover plate 24 and adhere the cover plate 24 to the adhesive layer 23. In a preferred implementation aspect, the adhesive layer 23 is a DAF or a hydrogel, but is not limited thereto.

The encapsulation layer 25 of the fingerprint recognition module of this application is cured and formed between the FPC board 21 and the cover plate 24 and seals the die 22 and the light-emitting diode component 28. An upper surface of the encapsulation layer 25 abuts against the cover plate 24, a lower surface of the encapsulation layer 25 abuts against the FPC board 21, and the encapsulation layer 25 surrounds and seals the die 22 and the light-emitting diode component 28. In this way, peripheries of the die 22 and the light-emitting diode component 28 are completely sealed to prevent external moisture or dust from eroding metal contacts of the die 22 and the light-emitting diode component 28, so as to reinforce a binding property of the entire fingerprint recognition module 2 and improve reliability of the entire fingerprint recognition module 2. In a preferred implementation aspect, a hot melt material is selected as a material of the encapsulation layer 25, and a property of the hot melt material is that the hot melt material is a solid body at a room temperature, and is melted into a fluid adhesive when being heated to a particular temperature.

Further, the hot melt material is doped with an astigmatism powder substance. Because the hot melt material also has a transparency or translucency property, after the hot melt material is solidified into the encapsulation layer 25, when passing through the encapsulation layer 25, a light ray from the light-emitting diode component 28 is dispersed by the astigmatism powder substance in the encapsulation layer 25. In this way, the light ray that passes through the encapsulation layer 25 presents an evenly dispersed status.

Figure 6:
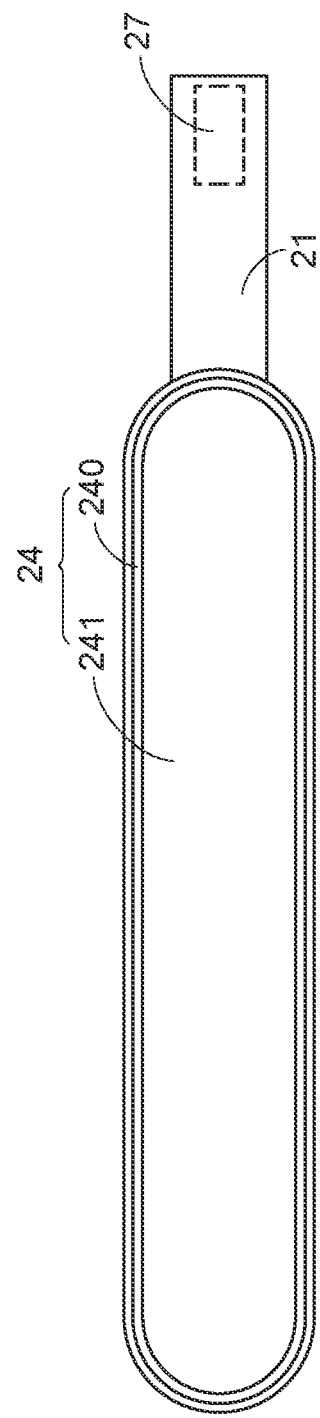
FIG. 6 is a top view of a fingerprint recognition module having a light-emitting function after completing low pressure injection modeling encapsulation according to this application.

Referring to FIG. 5 and FIG. 6 in combination, FIG. 6 is a top view of a fingerprint recognition module after completing low pressure injection modeling encapsulation according to this application. In addition, the cover plate 24 of the fingerprint recognition module of this application has a peripheral ring-shaped transparent area 240 and a central non-transparent area 241. The peripheral ring-shaped transparent area 240 surrounds the central non-transparent area 241. The peripheral ring-shaped transparent area 240 is formed along an inner circumference of the cover plate 24. The light-emitting diode component 28 is located below the encapsulation layer 25 and the cover plate 23. When the light-emitting diode component 28 emits light, after passing through the encapsulation layer 25, some light rays are shielded by the central non-transparent area 241 of the cover plate 24, and after being reflected several times, are transmitted out through the peripheral ring-shaped transparent area 240 of the cover plate 24, so that light is emitted in a ring shape on the upper surface of the cover plate 24. In this way, a user may be prompted to easily recognize a position at which the fingerprint recognition module of this application is disposed, and an effect of surface printing design (such as silk screen printing) of the cover plate 24 may be presented at the same time. A quantity of light-emitting diode components 28 is not limited herein.

The fingerprint recognition module 2 of this application further includes a carrier board 26. The carrier board 26 is located below the FPC board 21 to carry the FPC board 21, so as to improve structural strength of the entire fingerprint recognition module 2. In a preferred implementation aspect, the carrier board 26 is a structure-reinforced steel sheet. In addition, the fingerprint recognition module 2 of this application further includes a connector 27. The FPC board 21 may perform data transmission to the outside and obtain power from the outside by using the connector 27.

Figure 1:
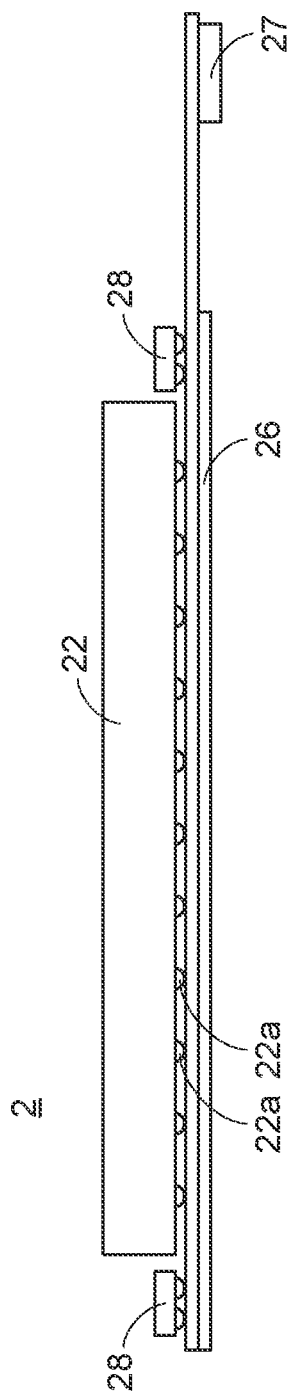
FIG. 1 is a sectional view of fixing a die and a light-emitting diode component of a fingerprint recognition module having a light-emitting function to an FPC board according to this application.
Figure 7A:
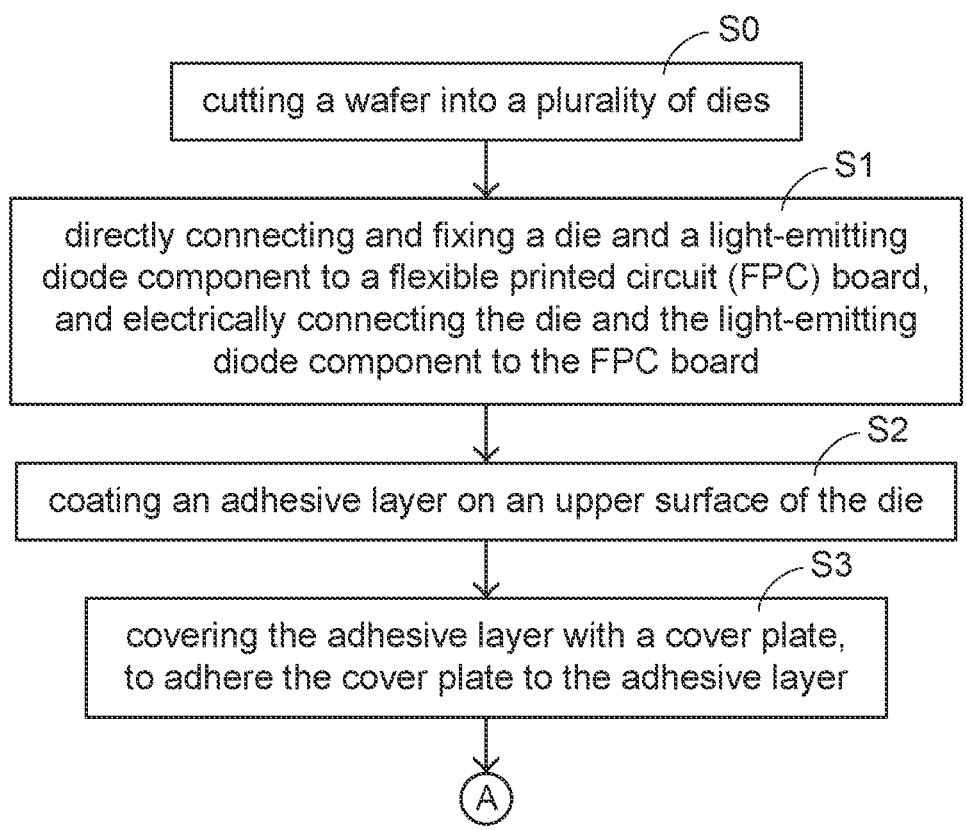
FIGS. 7A and 7B are a flowchart of a manufacturing method for a fingerprint recognition module having a light-emitting function according to this application.
Figure 7B:
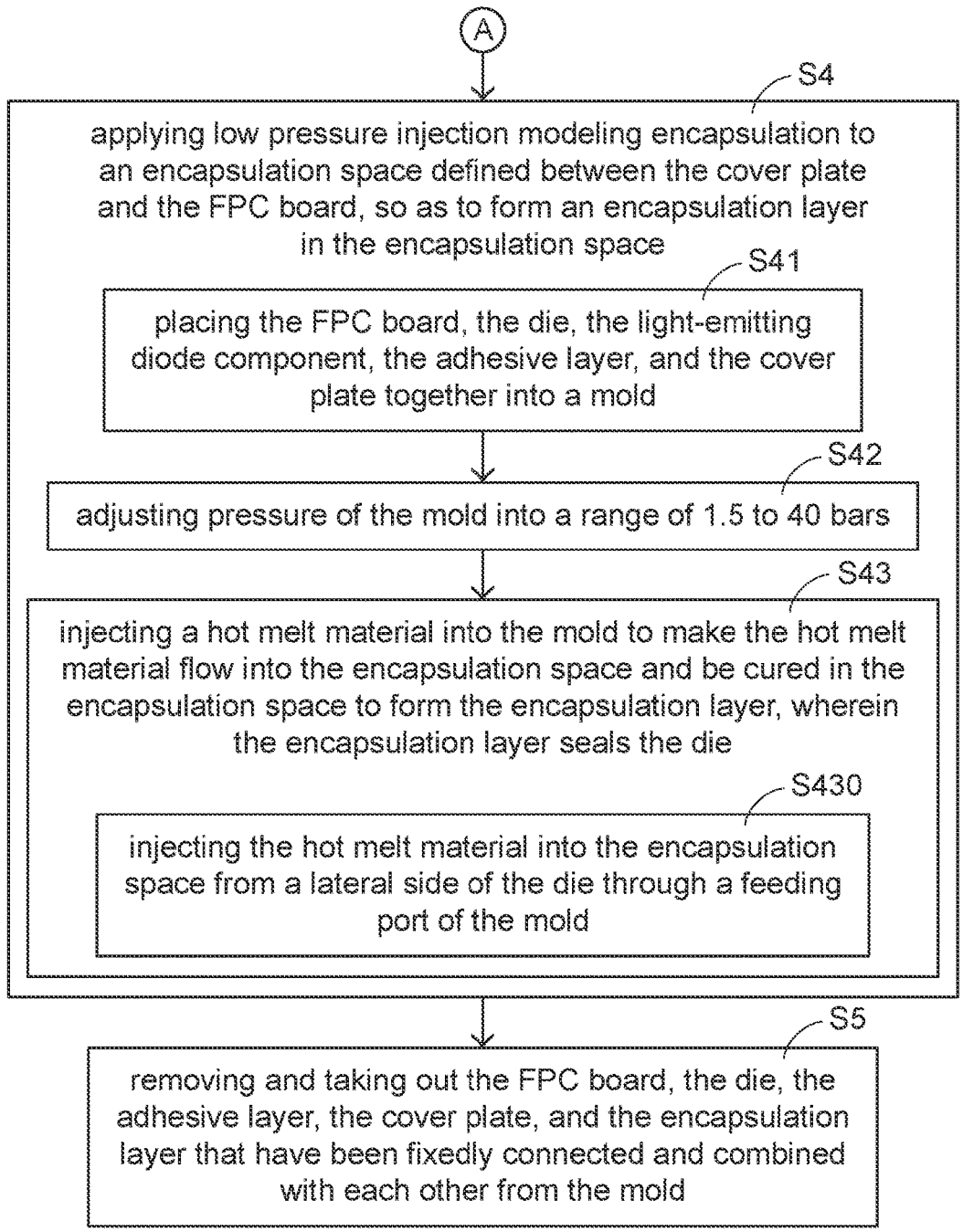

Referring to FIGS. 7A and 7B, FIGS. 7A and 7B are a flowchart of a manufacturing method for a fingerprint recognition module according to this application. In a manufacturing method for a fingerprint recognition module 2 having a light-emitting function of this application, as shown in FIG. 1, step S1 is performed first: Directly connect and fix a die 22 and a light-emitting diode component 28 to an FPC board 21, and electrically connect the die 22 and the light-emitting diode component 28 to the FPC board 21. The die 22 and the light-emitting diode component 28 respectively have a plurality of metal contacts 22a, and the die 22 and the light-emitting diode component 28 are electrically connected to the FPC board 21 through the plurality of metal contacts 22a thereof. In this application, the die 22 is fixed to an FPC board 21 in a welding manner. Preferably, a carrier board 26 is disposed below the FPC board 21, and the FPC board 21 is carried by the carrier board 26, so as to improve overall structural strength of the fingerprint recognition module of this application.

Figure 2:
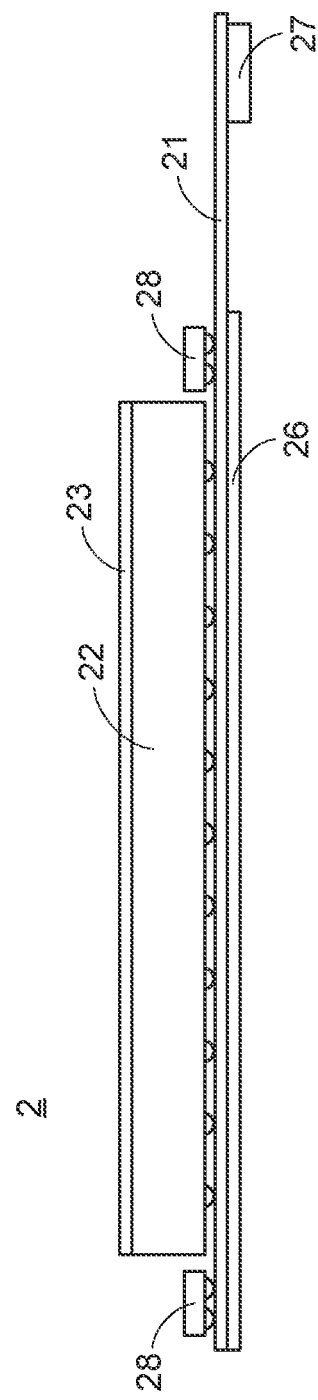
FIG. 2 is a sectional view of coating an adhesive layer of a fingerprint recognition module having a light-emitting function on an upper surface of a die according to this application.
Figure 3:
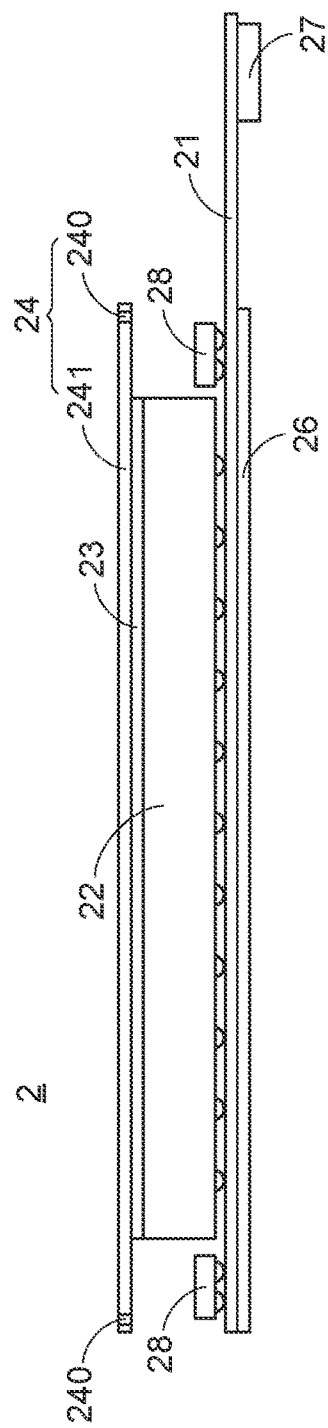
FIG. 3 is a sectional view of covering an adhesive layer with a cover plate of a fingerprint recognition module having a light-emitting function according to this application.

After step S1, step S2 is performed. In step S2, as shown in FIG. 2, an adhesive layer 23 is coated on an upper surface of the die 22. Subsequently, step S3 is performed. As shown in FIG. 3, the adhesive layer 23 is covered with a cover plate 24, so as to adhere the cover plate 24 to the adhesive layer 23. By means of step S2 and step S3, the cover plate 24 can be combined with the die 22 and be located above the die 22. In a preferred implementation aspect, the so-called cover plate 24 in this application may be made of a ceramic or glass material.

Figure 4:
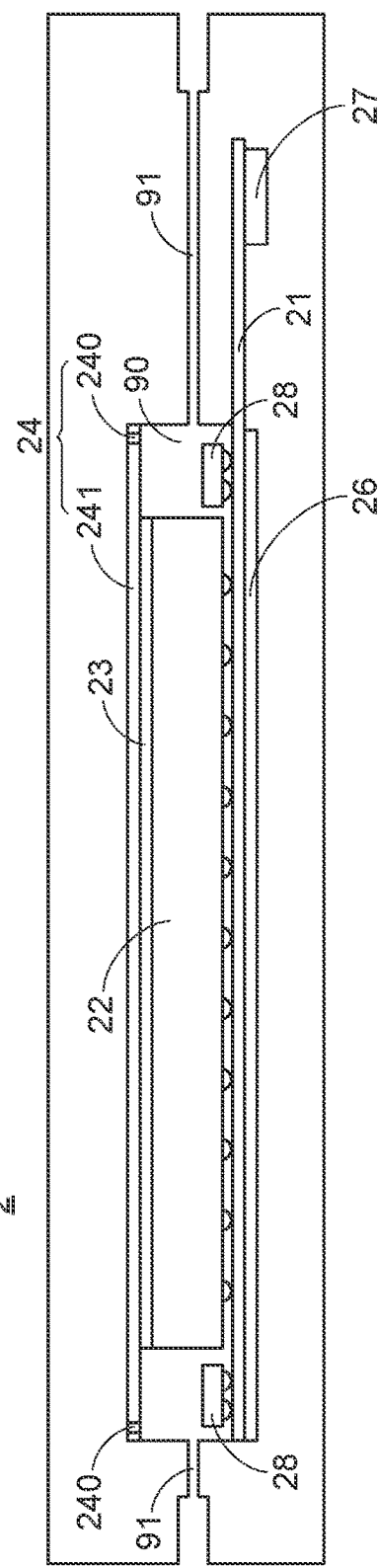
FIG. 4 is a sectional view of placing a cover plate, an adhesive layer, a die, a light-emitting diode component, and an FPC board into a low pressure injection modeling mold according to this application.

Subsequently, step S4 is performed. In step S4, as shown in FIG. 4, low pressure injection modeling encapsulation is performed on an encapsulation space 90 between the cover plate 24 and the FPC board 21, so as to form an encapsulation layer 25 in the encapsulation space 90. One advantage of the low pressure injection modeling encapsulation is that, compared with conventional high pressure modeling, use of the low pressure injection modeling encapsulation results in higher smoothness. It should be particularly noted herein that the encapsulation space 90 is defined between a lower surface of the cover plate 24 and an upper surface of the FPC board 21.

Specifically, the low pressure injection modeling process applied to this application is an open-mold process, and is an encapsulation process of injecting a hot melt material into a mold 9 at a low injection pressure to rapidly curing and modeling the hot melt material, so as to produce effects such as a waterproof effect, a dustproof effect, and a shock resistance effect. Step S4 further includes the following steps S41 to S43. Step S41: Place the FPC board 21, the die 22, the light-emitting diode component 28, the adhesive layer 23, and the cover plate 24 together into a mold 9, to prepare for encapsulation inside the mold 9. Step S42: Adjust pressure of the mold 9 into a range of 1.5 to 40 bars. The pressure range is merely a preferred example for describing a low pressure range in this application, and can be adjusted according to an actual environment and requirements. Step S43: Inject a hot melt material into the mold 9, to make the hot melt material flow into the encapsulation space 90 and be cured in the encapsulation space 90 to form encapsulation layer 25, where the encapsulation layer 25 seals the die 22 and the light-emitting diode component 28. Step S43 further includes step S430: Inject the hot melt material into the encapsulation space 90 from a lateral side of the die 22 and the light-emitting diode component 28 through a feeding port 91 of the mold 9.

After step (d), the method further includes step (e). In step (e), as shown in FIG. 5, the FPC board 21, the die 22, the light-emitting diode component 28, the adhesive layer 23, the cover plate 24, and the encapsulation layer 25 that have been fixedly connected and combined with each other are removed and taken out from the mold 9, to form a complete finished product of the fingerprint recognition module 2.

Besides, before step (a), the method further includes step (a0): cutting a wafer into a plurality of dies 22. The so-called die 22 of this application is a finished product cut from the wafer.

Based on the above, in the fingerprint recognition module having a light-emitting function of this application, after being directly connected to and combined with the FPC board, the die and the light-emitting diode component are encapsulated on the FPC board. In this way, a conventional manufacturing procedure in which the die needs to be first combined with an IC substrate is omitted, and meanwhile, encapsulation and manufacturing costs are lowered. In addition, a peripheral ring-shaped transparent area is disposed on the cover plate of the fingerprint recognition module of this application. By means of the transparent or translucent encapsulation layer doped with an astigmatism powder substance, a light ray from the light-emitting diode component can be evenly transmitted out of the encapsulation layer, and then, light is emitted outward through the peripheral ring-shaped transparent area, leading to an advantage of presenting a light-emitting effect to indicate a press position and make a user clearly learn a working status of the current fingerprint recognition module.

The foregoing embodiments merely illustratively describe the principles and effects of the present invention and explain technical features of the present invention instead of limiting the protection scope of the present invention. All the changes or equivalent arrangements that can be easily completed by persons skilled in the art without departing from the technical principles and spirit of the present invention fall within the scope claimed by the present invention. Therefore, the protection scopes of the present invention are listed as the following claims.

What is claimed is:

1. A manufacturing method for a fingerprint recognition module having a light-emitting function, comprising the following steps:
   (a) directly connecting and fixing a die and a light-emitting diode component to a flexible printed circuit (FPC) board, and electrically connecting the die and the light-emitting diode component to the FPC board;
   (b) coating an adhesive layer on an upper surface of the die;
   (c) covering the adhesive layer with a cover plate, to adhere the cover plate to the adhesive layer; and
   (d) applying low pressure injection modeling encapsulation to an encapsulation space defined between the cover plate and the FPC board, so as to form an encapsulation layer in the encapsulation space, wherein step (d) further comprises the following steps:
      (d1) placing the FPC board, the die, the light-emitting diode component, the adhesive layer, and the cover plate together into a mold;
      (d2) adjusting pressure of the mold into a range of 1.5 to 40 bars; and
      (d3) injecting a hot melt material into the mold to make the hot melt material flow into the encapsulation space and be cured in the encapsulation space to form the encapsulation layer, wherein the encapsulation layer seals the die.

2. The manufacturing method for a fingerprint recognition module having a light-emitting function according to claim 1, wherein in step (d3), the hot melt material is doped with an astigmatism powder substance, so as to transmit and disperse a light ray from the light-emitting diode component upward.

3. The manufacturing method for a fingerprint recognition module having a light-emitting function according to claim 1, wherein step (d3) further comprises the following step:
(d30) injecting the hot melt material into the encapsulation space from a lateral side of the die through a feeding port of the mold.

4. The manufacturing method for a fingerprint recognition module having a light-emitting function according to claim 1, wherein before step (a), the method further comprises the following step:
(a0) cutting a wafer into a plurality of dies.

5. The manufacturing method for a fingerprint recognition module having a light-emitting function according to claim 1, wherein after step (d), the method further comprises the following step:
(e) removing and taking out the FPC board, the die, the adhesive layer, the cover plate, and the encapsulation layer that have been fixedly connected and combined with each other from the mold.

6. A fingerprint recognition module having a light-emitting function, comprising:
a flexible printed circuit (FPC) board;
a die, directly connected to and disposed on the FPC board, and electrically connected to the FPC board;
a light-emitting diode component, disposed on the FPC board, and electrically connected to the FPC board;
an adhesive layer, coated on an upper surface of the die;
a cover plate, covering the adhesive layer; and
an encapsulation layer, cured and formed between the FPC board and the cover plate, and sealing the die and the light-emitting diode component, wherein a hot melt material is selected as a material of the encapsulation layer, and the hot melt material is doped with an astigmatism powder substance, so as to transmit and disperse a light ray from the light-emitting diode component upward.

7. The fingerprint recognition module having a light-emitting function according to claim 6, wherein the cover plate is provided with a peripheral ring-shaped transparent area, and the peripheral ring-shaped transparent area is disposed along a circumference of the cover plate.

8. The fingerprint recognition module having a light-emitting function according to claim 6, wherein an upper surface of the encapsulation layer abuts against the cover plate, a lower surface of the encapsulation layer abuts against the FPC board, and the encapsulation layer surrounds and seals the die and the light-emitting diode component.

9. The fingerprint recognition module having a light-emitting function according to claim 6, wherein the adhesive layer is a die attach film (DAF) or a hydrogel.

10. The fingerprint recognition module having a light-emitting function according to claim 6, further comprising a carrier board, wherein the carrier board is located below the FPC board to carry the FPC board.

* * * * *